(12) United States Patent
Brown et al.

(10) Patent No.: US 10,444,278 B2
(45) Date of Patent: *Oct. 15, 2019

(54) TESTING SYSTEM AND METHOD

(71) Applicant: Xcerra Corporation, Norwood, MA (US)

(72) Inventors: Benjamin Brown, Palo Alto, CA (US); Niraj Rangwala, San Jose, CA (US); David McConnell, Oakland, CA (US); Peter Ho, Union City, CA (US); Howard Maassen, Milpitas, CA (US)

(73) Assignee: Xcerra Corporation, Norwood, MA (US)

( * ) Notice: Subject to any disclaimer, the term of this patent is extended or adjusted under 35 U.S.C. 154(b) by 36 days.

This patent is subject to a terminal disclaimer.

(21) Appl. No.: 15/703,351

(22) Filed: Sep. 13, 2017

(65) Prior Publication Data

US 2018/0080979 A1 Mar. 22, 2018

Related U.S. Application Data

(60) Provisional application No. 62/395,806, filed on Sep. 16, 2016.

(51) Int. Cl.
*G01R 31/28* (2006.01)
*G01R 1/073* (2006.01)
(Continued)

(52) U.S. Cl.
CPC ..... *G01R 31/2834* (2013.01); *G01R 1/07378* (2013.01); *G01R 1/07385* (2013.01); *G01R 19/25* (2013.01); *G01R 31/31924* (2013.01)

(58) Field of Classification Search
CPC ............ G01R 31/2889; G01R 31/2891; G01R 31/2855; G01R 31/2863; G01R 31/287;
(Continued)

(56) References Cited

U.S. PATENT DOCUMENTS 6,192,797 B1 * 2/2001 Rea .................... B41F 31/08
101/202
6,195,772 B1 2/2001 Mielke et al.
(Continued)

FOREIGN PATENT DOCUMENTS

TW 500926 B 9/2002
TW 201043970 A 12/2010
TW 201445142 A 12/2014

OTHER PUBLICATIONS

First Office Action issued in counterpart Taiwan Patent Application No. 106131776 dated May 8, 2018.
(Continued)

*Primary Examiner* — Vinh P Nguyen
(74) *Attorney, Agent, or Firm* — Brian J. Colandreo; Michael T. Abramson; Holland & Knight LLP

(57) ABSTRACT

A method, computer program product, computing system, and an automated test platform for testing at least one device under test includes a test head configured to receive the at least one device under test. A processing system is configured to: provide a voltage signal having a plurality of voltages to the at least one device under test, monitor a current flow into the at least one device under test during each of the plurality of voltages, thus generating a plurality of monitored current values that correspond to the plurality of voltages, and determine if one or more of the plurality of monitored current values exceeds one or more of a plurality of current thresholds.

20 Claims, 4 Drawing Sheets

(51) Int. Cl.
*G01R 19/25* (2006.01)
*G01R 31/319* (2006.01)

(58) Field of Classification Search
CPC ............ G01R 31/2887; G01R 31/2851; G01R 31/31924; G01R 31/003; G01R 31/26; G01R 31/2642; G01R 31/2868; G01R 31/2872; G01R 31/2834; G01R 1/0491; G01R 31/31905; G01R 1/0416; G01R 31/31907; G01R 31/31908; G01R 31/2853; G01R 31/31926; G01R 35/005; G01R 1/067; G01R 31/002; G01R 31/28; G01R 31/2874; G01R 31/2894; G01R 31/3025; G01R 19/04; G01R 19/16566; G06F 11/2733; G06F 13/4068; G06F 2212/1036; G06F 3/061; G06F 11/277; H04L 63/08
See application file for complete search history.

(56) References Cited

U.S. PATENT DOCUMENTS

| | | | |
|---|---|---|---|
| 6,201,747 B1 | 3/2001 | Bhimachar et al. | |
| 6,405,148 B1 | 6/2002 | Hayashi et al. | |
| 6,489,797 B1 | 12/2002 | MacDonald et al. | |
| 6,937,006 B2 * | 8/2005 | West | G01R 31/31924 324/750.01 |
| 7,253,606 B2 * | 8/2007 | Loh | G01R 31/2886 324/750.01 |
| 8,030,959 B2 * | 10/2011 | Franco | G01R 31/31721 324/750.3 |
| 2003/0197521 A1 | 10/2003 | Weimer | |
| 2005/0024041 A1 | 2/2005 | West | |
| 2006/0170435 A1 | 8/2006 | Granicher et al. | |
| 2006/0227479 A1 | 10/2006 | Bald et al. | |
| 2006/0282735 A1 * | 12/2006 | Weinraub | G01R 31/31905 714/742 |
| 2007/0186131 A1 * | 8/2007 | Goodrich | G01R 31/2889 714/724 |
| 2008/0091993 A1 | 4/2008 | Miao et al. | |
| 2008/0126903 A1 | 5/2008 | Wegener | |
| 2009/0309556 A1 | 12/2009 | Franco et al. | |
| 2014/0361798 A1 | 12/2014 | Johnson et al. | |
| 2015/0316614 A1 * | 11/2015 | Petrov | G01R 31/2834 702/108 |

OTHER PUBLICATIONS

First Office Action issued in Taiwan Patent Application No. 106131777 dated Aug. 7, 2018.
International Search Report issued in Application Serial No. PCT/US2017/051281 dated Nov. 20, 2017.
International Search Report issued in Application Serial No. PCT/US2017/051275 dated Nov. 17, 2017.
Non-Final Office Action issued in U.S. Appl. No. 15/703,319 dated Nov. 23, 2018.

* cited by examiner

TESTING SYSTEM AND METHOD

RELATED APPLICATION

This application claims the benefit of U.S. Provisional Application No. 62/395,806, filed on 16 Sep. 2016 and entitled "DEVICE TESTING SYSTEM AND METHOD".

TECHNICAL FIELD

This disclosure relates to automated testing equipment and, more particularly, to automated testing equipment that monitors signals applied to numerous test points of a Device Under Test (DUT).

BACKGROUND

Oftentimes, different industries have differing levels of acceptability concerning parts/component failure. For example, the low cost toy industry may have less stringent standards concerning parts/component failure, while other industries may have much more strict standards concerning acceptable levels of failure.

One industry that has very strict standards concerning acceptable levels of failure is the automotive industry. There are many integrated circuits in vehicles and, if any one breaks, the vehicle may not operate properly. Since some of these devices may be in safety critical applications, failure can have severe consequences; wherein other failures may result in excess pollution or may violate regulatory requirements. Even failures that seem small (e.g., a faulty seat memory circuit) may result in consumer dissatisfaction and expensive repair.

Additionally, vehicles may operate in very harsh and varied environments. Temperature extremes may run from the Alaskan north to the Arizona desert. Further, cars may be subjected to e.g., high and low levels of humidity/moisture, high electric fields, and mechanical shock. Additionally, cars must withstand common faults, such as a technician who installs battery cables backwards or incorrect voltages caused by e.g., a faulty alternator, a depleted battery, or corroded contact.

In order to ensure the highest quality vehicles, vehicle manufacturers have extremely high quality standards and insist on the highest quality level components. For example, they may drive semiconductor suppliers for "Zero DPM (i.e., Zero Defective Parts per Million". While this ideal may not be truly achievable, integrated circuit suppliers strive to come as close as possible to this standard.

One key parameter that vehicle manufacturers test for is the quality of the oxides used in the integrated circuits, wherein an oxide is an electrical isolation layer. If an oxide breaks down at a low voltage, the device may not be of acceptable quality. So integrated circuit manufacturers may need to apply extreme voltages (e.g., ±100V) to the terminals of the integrated circuit. The manufacture may then measure the current flowing into and out of the pins of the Device Under Test (i.e., DUT) as these extreme voltages are applied, wherein if the current measured is large, the manufacture may know that one or more oxide layers have broken down and the DUT may be defective.

SUMMARY OF DISCLOSURE

Overload Protection

In one implementation, an automated test platform for testing at least one device under test includes a test head configured to receive the at least one device under test. A processing system is configured to: provide a voltage signal having a plurality of voltages to the at least one device under test, monitor a current flow into the at least one device under test during each of the plurality of voltages, thus generating a plurality of monitored current values that correspond to the plurality of voltages, and determine if one or more of the plurality of monitored current values exceeds one or more of a plurality of current thresholds.

One or more of the following features may be included. An interconnection platform may be configured to couple the processing system and the test head. An adapter board may be configured to couple the at least one device under test to the test head. The at least one device under test may include a plurality of devices under test. The adapter board may be configured to couple the plurality of devices under test to the test head. A switching system may be associated with the at least one device under test. The switching system may be configured to selectively disconnect the voltage signal having the plurality of voltages from the at least one device under test. The processing system may be further configured to disconnect the voltage signal having the plurality of voltages from the at least one device under test if one or more of the plurality of monitored current values exceeds one or more of the plurality of current thresholds. The switching system may include one or more of: at least one mechanical switch assembly; and at least one solid state switch assembly. The voltage signal having the plurality of voltages may be a temporally-defined voltage signal having a plurality of voltages, wherein an amplitude and a duration are defined for each of the plurality of voltages. The plurality of monitored current values may be temporally aligned with the temporally-defined voltage signal.

In another implementation, a computer program product resides on a computer readable medium that has a plurality of instructions stored on it. When executed by a processor, the instructions cause the processor to perform operations including providing a voltage signal having a plurality of voltages to the at least one device under test, monitoring a current flow into the at least one device under test during each of the plurality of voltages, thus generating a plurality of monitored current values that correspond to the plurality of voltages, and determining if one or more of the plurality of monitored current values exceeds one or more of a plurality of current thresholds.

One or more of the following features may be included. The voltage signal having the plurality of voltages may be a temporally-defined voltage signal having a plurality of voltages, wherein an amplitude and a duration are defined for each of the plurality of voltages. The plurality of monitored current values may be temporally aligned with the temporally-defined voltage signal.

In another implementation, a computing system includes at least one processor and at least one memory architecture coupled with the at least one processor, wherein the computing system is configured to perform operations including providing a voltage signal having a plurality of voltages to the at least one device under test, monitoring a current flow into the at least one device under test during each of the plurality of voltages, thus generating a plurality of monitored current values that correspond to the plurality of voltages, and determining if one or more of the plurality of monitored current values exceeds one or more of a plurality of current thresholds.

One or more of the following features may be included. The voltage signal having the plurality of voltages may be a temporally-defined voltage signal having a plurality of voltages, wherein an amplitude and a duration are defined for each of the plurality of voltages. The plurality of monitored current values may be temporally aligned with the temporally-defined voltage signal.

In another implementation, a computer-implemented method is executed on a computing device and includes providing a voltage signal having a plurality of voltages to the at least one device under test, monitoring a current flow into the at least one device under test during each of the plurality of voltages, thus generating a plurality of monitored current values that correspond to the plurality of voltages, and determining if one or more of the plurality of monitored current values exceeds one or more of a plurality of current thresholds.

One or more of the following features may be included. The voltage signal having the plurality of voltages may be a temporally-defined voltage signal having a plurality of voltages, wherein an amplitude and a duration are defined for each of the plurality of voltages. The plurality of monitored current values may be temporally aligned with the temporally-defined voltage signal.

The details of one or more implementations are set forth in the accompanying drawings and the description below. Other features and advantages will become apparent from the description, the drawings, and the claims.

BRIEF DESCRIPTION OF THE DRAWINGS

Like reference symbols in the various drawings indicate like elements.

DETAILED DESCRIPTION OF THE
PREFERRED EMBODIMENTS

Figure 1:
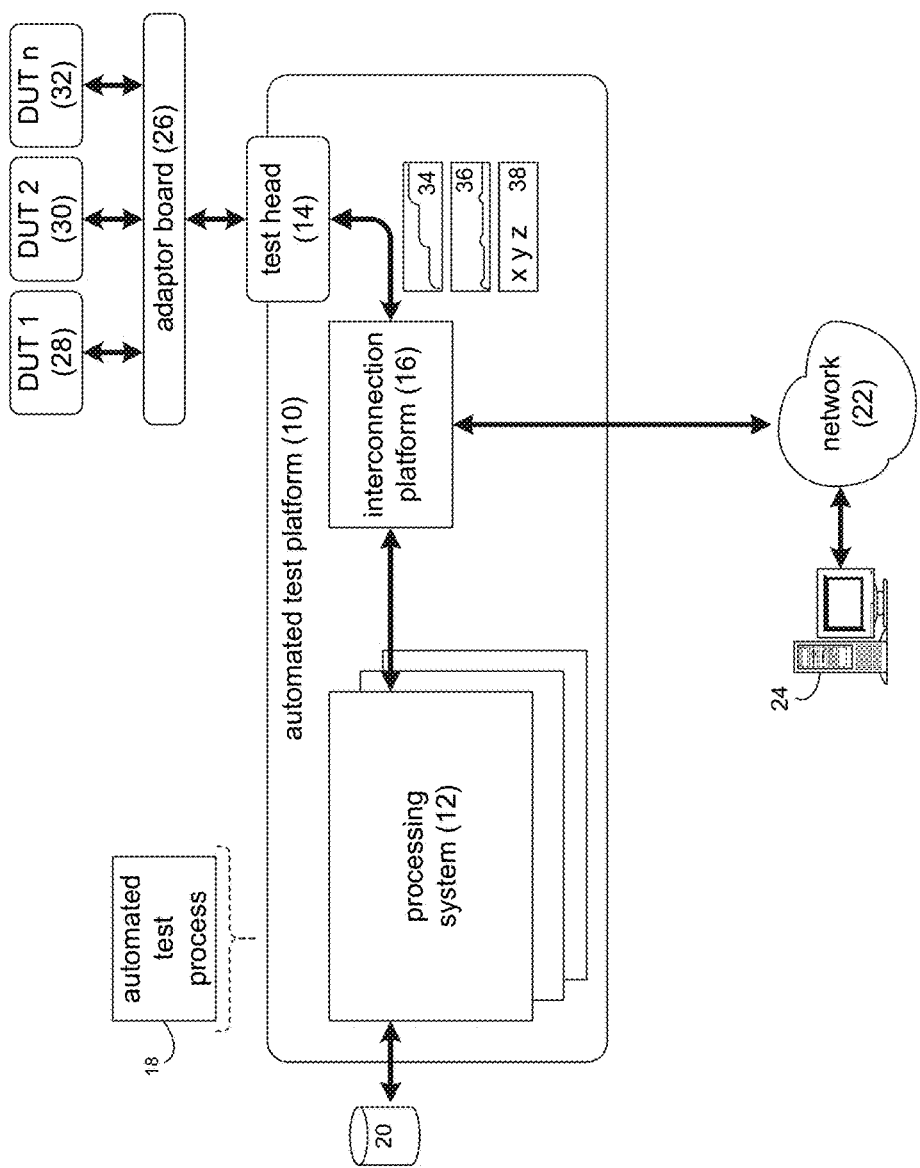
FIG. 1 is a diagrammatic view of an automated test platform, including a processing system, according to one implementation of this disclosure.

System Overview:

Referring to FIG. 1, there is shown automated test platform 10. Examples of automated test platform 10 may include, but are not limited to, systems that automate the verification and validation of devices under test (DUTs). Automated test equipment systems (e.g. automated test platform 10) may be used to test various electronic components in an automated fashion. Typically, the devices under test (DUTs) may be subjected to a battery of different tests, wherein the testing procedures may be automated in a logical fashion. For example, during the testing of a power supply, the power supply may be subjected to varying voltage levels and varying voltage frequencies. Further, during the testing of a noise canceling circuit, such a circuit may be subjected to varying levels and frequencies of noise to confirm the satisfactory performance of the same.

Automated test platform 10 may include one or more processing systems (e.g. processing system 12) and one or more test heads (e.g. test head 14) configured to receive at least one device under test, wherein processing system 12 and test head 14 may be coupled together via interconnection platform 16 (e.g., a PCIe bus or a USB bus).

If configured as a PCIe bus, interconnection platform 16 may allow for test head 14 and processing system 12 to communicate via interconnection platform 16 using the PCIe communication standards. As is known in the art, PCIe (Peripheral Component Interconnect Express) is a high-speed serial computer expansion bus standard designed to replace older bus systems (e.g., PCI, PCI-X, and AGP). Through the use of PCIe, higher maximum system bus throughput may be achieved. Other benefits may include lower I/O pin count, a smaller physical footprint, better performance-scaling for bus devices, a more detailed error detection and reporting mechanism, and native plug-n-play functionality.

If configured as a USB bus, interconnection platform 16 may allow for test head 14 and Processing system 12 to communicate via interconnection platform 16 using the USB communication standards. As is known in the art, Universal Serial Bus (USB) is an industry standard that defines the cables, connectors and communications protocols used in a bus for connection, communication, and power supply between computers and various electronic devices/components.

Examples of processing system 12 may include but are not limited to a personal computer, a server computer, a series of server computers, a mini computer, a single-board computer, a field programmable gate array (FPGA), one or more specialized digital circuit boards, and/or one or more specialized analog circuit boards. Processing system 12 may execute one or more operating systems, examples of which may include but are not limited to: Microsoft Windows™; Redhat Linux™, Unix, or a custom operating system, for example.

While in this particular example, automated test platform 10 is shown to include three processing systems, this is for illustrative purposes only and is not intended to be a limitation of this disclosure, as other configurations are possible. For example, the number of processing systems utilized within automated test platform 10 may be increased or decreased depending upon the anticipated loading of automated test platform 10.

Processing system 12 may execute one or more automated test programs (e.g. automated test process 18), wherein automated test process 18 may be configured to automate the testing of various devices under test. Through the use of automated test process 18, an administrator (not shown) of automated test platform 10 may define and execute testing procedures/routines for the various devices under test.

The instruction sets and subroutines of automated test process 18, which may be stored on storage device 20 coupled to/included within processing system 12, may be executed by one or more processors (not shown) and one or more memory architectures (not shown) included within processing system 12. Examples of storage device 20 may include but is not limited to: a hard disk drive; an optical drive; a RAID device; a random access memory (RAM); a read-only memory (ROM); and all forms of flash memory storage devices.

Processing system 12 may be connected to one or more networks (e.g., network 22), examples of which may include but are not limited to: a local area network, a wide area network, an intranet or the internet. Accordingly, processing system 12 may be administered and/or controlled via network 22. Therefore, an administrator (not shown) may use a remote computer (e.g., remote computer 24) coupled to network 22 to define and/or administer various testing procedures and/or routines via automated test process 18.

Automated test platform 10 may be configured to work with adapter board 26. wherein adapter board 26 may be configured to adapt test head 14 (which may be universal) to the particular type of device under test. For example, test head 14 may be a universal connector assembly that is configured to provide signals to and/or read signals from the device under test.

In this particular example, adapter board 26 is shown being configured to accommodate a plurality of devices under test, namely devices under test 28, 30, 32 (representing DUTs 1-n). However, this is for illustrative purposes only. For example, the number of devices under test may be increased or decreased depending upon the design criteria of adapter board 26, automated test platform 10 and/or automated test process 18. Alternatively, test head 14 may be configured to work without adapter board 26, wherein test head 14 may be configured to allow a single device under test (e.g., device under test 28) to directly plug into/couple with test head 14. Processing system 12 may be configured to provide signals to adaptor board 26 and/or devices under test 28, 30, 32.

Figure 2:
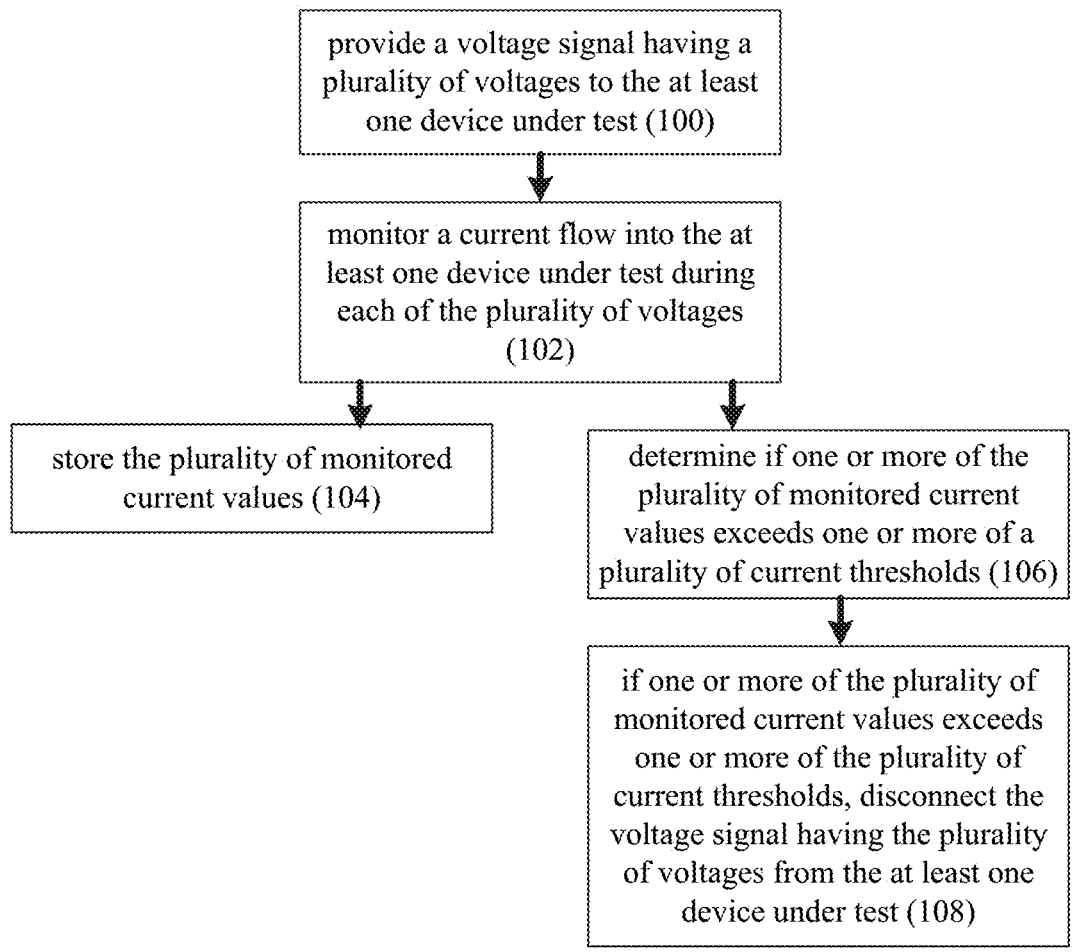
FIG. 2 is a flowchart of an automated test process executed by the processing system of FIG. 1.

Referring also to FIG. 2 and as will be discussed below in greater detail, processing system 12 (and automated test process 18) may be configured to provide 100 a voltage signal (e.g., voltage signal 34) having a plurality of voltages to the at least one device under test (e.g., devices under test 28, 30, 32) while monitoring 102 a current flow into the at least one device under test (e.g., devices under test 28, 30, 32) during each of the plurality of voltages (included within voltage signal 34), thus generating a plurality of monitored current values (e.g., current values 36) that correspond to the plurality of voltages (included within voltage signal 34).

Voltage signal 34 may be a complex voltage signal that may be applied to the devices under test (e.g., devices under test 28, 30, 32) to ensure that they do not fail due to e.g., insulation breakdown, oxide layer breakdown or component failure. For example, voltage signal 34 may be a temporally-defined voltage signal that includes a plurality of voltages (each of which has a defined amplitude and a duration).

| Force V | 30 V | 30 V | 35 V | 35 V | 40 V | 40 V | 40 V | 40 V |
|---|---|---|---|---|---|---|---|---|
| Time Duration | 10 ms | 100 us | 40 us | 60 us | 40 us | 60 us | 200 us | 60 us |
| Current Limit | 5 mA | 10 uA | 5 mA | 10 uA | 5 mA | 10 uA | 10 uA | 10 uA |
| Peak Detect enable | False | True | False | True | False | True | True | True |
| Number of Samples | 0 | 5 | 0 | 3 | 0 | 3 | 0 | 3 |

One example of voltage 34 is defined in the table above, which is shown to include eight distinct portions as follows:
Portion 1: an amplitude of 30 VDC for 10 milliseconds;
Portion 2: an amplitude of 30 VDC for 100 microseconds;
Portion 3: an amplitude of 35 VDC for 40 microseconds;
Portion 4: an amplitude of 35 VDC for 60 microseconds;
Portion 5: an amplitude of 40 VDC for 40 microseconds;
Portion 6: an amplitude of 40 VDC for 60 microseconds;
Portion 7: an amplitude of 40 VDC for 200 microseconds; and
Portion 8: an amplitude of 40 VDC for 60 microseconds.

The plurality of monitored current values (e.g., current values 36) may be temporally aligned with the temporally-defined voltage signal (e.g., voltage signal 34), wherein the plurality of monitored current values (e.g., current values 36) may represent the current flowing into each of the devices under test (e.g., devices under test 28, 30, 32) during (in this example) the eight above-described portions of voltage signal 34.

As will be discussed below in great detail, processing system 12 (and automated test process 18) may further be configured to store 104 the plurality of monitored current values (e.g., current values 36) for subsequent analysis/processing/review. Additionally, processing system 12 (and automated test process 18) may be configured to determine 106 if one or more of the plurality of monitored current values (e.g., current values 36) exceeds one or more of a plurality of current thresholds (e.g., current thresholds 38). If one or more of the plurality of monitored current values (e.g., current values 36) exceeds one or more of the plurality of current thresholds (e.g., current thresholds 38), processing system 12 (and automated test process 18) may disconnect 108 the voltage signal (e.g., voltage signal 34) having the plurality of voltages from the at least one device under test (e.g., devices under test 28, 30, 32).

Figure 3:
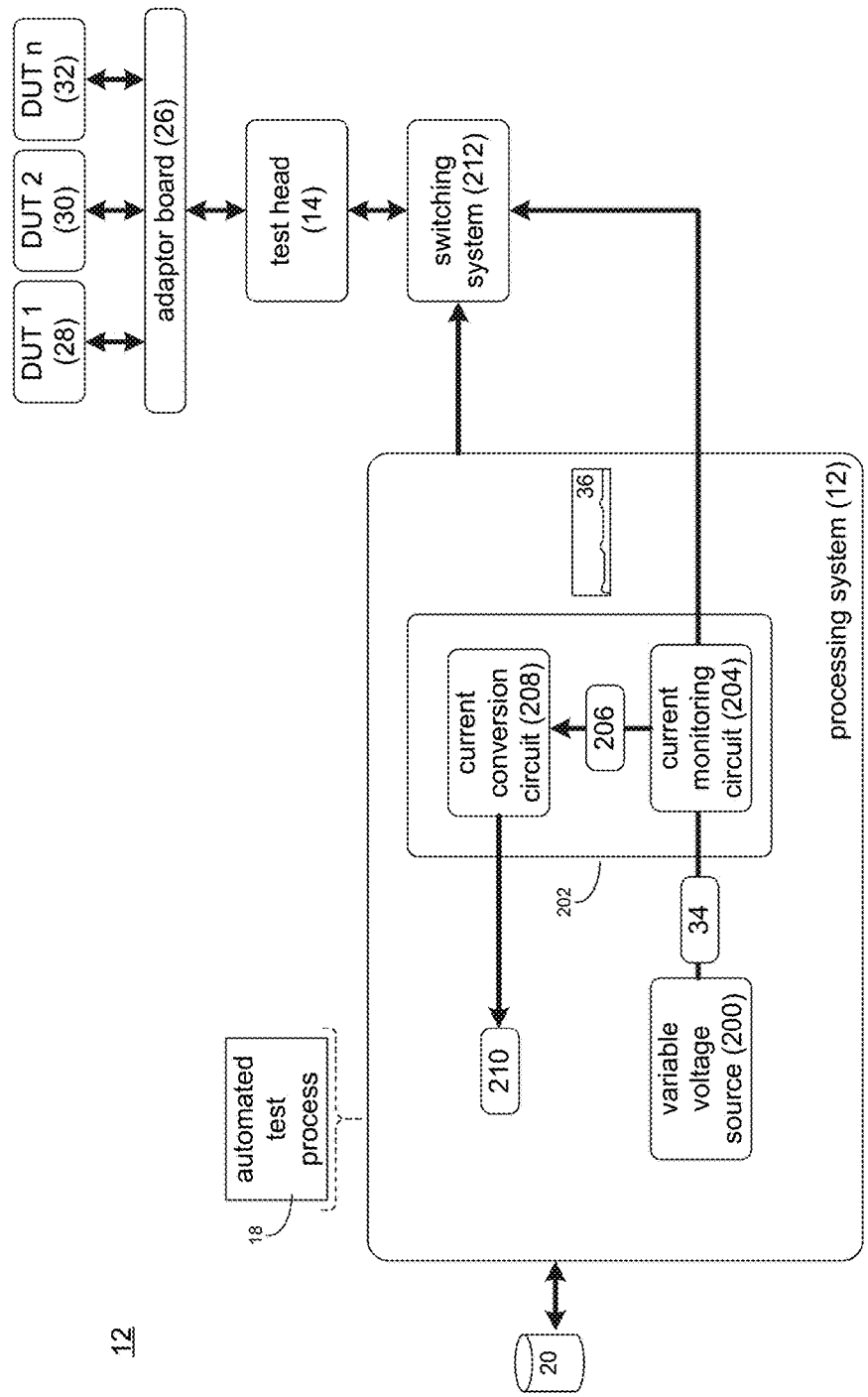
FIG. 3 is a diagrammatic detail view of the processing system of FIG. 1.

Referring also to FIG. 3, there is shown one embodiment of processing system 12, wherein processing system 12 is shown to include variable voltage source 200 that may be controlled by automated test process 18 and may be configured to provide voltage signal 34 to the at least one device under test (e.g., devices under test 28, 30, 32). As discussed above, voltage signal 34 may be a complex voltage signal that may be applied to the devices under test (e.g., devices under test 28, 30, 32) to ensure that they do not fail due to e.g., insulation breakdown, oxide layer breakdown or component failure.

Processing system 12 may further include current monitoring system 202 configured to define the plurality of monitored current values (e.g., current values 36) that correspond to the plurality of voltages included within voltage signal 34. As discussed above, voltage signal 34 may include a plurality of defined voltages that change while testing devices under test 28, 30, 32. Current monitoring system 202 may be configured to monitor the quantity of current that is flowing into each of (in this example) devices under test 28, 30, 32 as the amplitude of the voltage within voltage signal 34 is changed by variable voltage source 200.

Current monitoring system 202 may include current monitoring circuit 204 that may be configured to generate analog representation 206 of the plurality of monitored current values (e.g., current values 36). Current monitoring circuit 204 may include one or more discrete electronic components (such as operational amplifiers) that may be utilized to generate analog representation 206 of the plurality of monitored current values (e.g., current values 36). For example, voltage signal 34 may flow through a control resistor (not shown) included within current monitoring circuit 204, wherein the voltage across this control resistor (not shown) may be monitored by a operational amplifier (not shown) so that the current flowing through the control resistor (not shown) may be determined, as the current flowing through the control resistor (not shown) would be the same as the current being provided to devices under test 28, 30, 32. In such a configuration, current monitoring circuit 204 may include three control resistors (not shown) and three operational amplifiers (not shown), thus providing three distinct current paths so that the quantity of current flowing into each of devices under test 28, 30, 32 may be individually monitored 102 by processing system 12 (and automated test process 18).

As processing system 12 may be a digital circuit, current monitoring system 202 may further include current conversion circuit 208 configured to convert analog representation 206 of the plurality of monitored current values (e.g., current values 36) into digital representation 210 of the plurality of monitored current values (e.g., current values 36). For example, current conversion circuit 208 may include an analog-to-digital convertor that may be configured to receive analog representation 206 of the plurality of monitored current values (e.g., current values 36) and convert it into digital representation 210 of the plurality of monitored current values (e.g., current values 36), thus allowing such measurements to be utilized by processing system 12 and automated test process 18.

Automated test platform 10 may further include a switching system (e.g., switching system 212) associated with the at least one device under test. Specifically, switching system 212 may be configured to selectively disconnect voltage signal 34 having the plurality of voltages from the at least one device under test (e.g., devices under test 28, 30, 32), wherein switching system 212 may include one or more of: at least one mechanical switch assembly (e.g., a relay, not shown) and at least one solid state switch assembly (e.g., a FET switch, not shown).

In the configuration described above wherein there are three devices under test (e.g., devices under test 28, 30, 32), switching system 212 may include three discrete switches (not shown), thus allowing for the current flowing into each of the devices under test 28, 30, 32 to be separately monitored 102 and separately controlled by processing system 12 (and automated test process 18).

Figure 4:
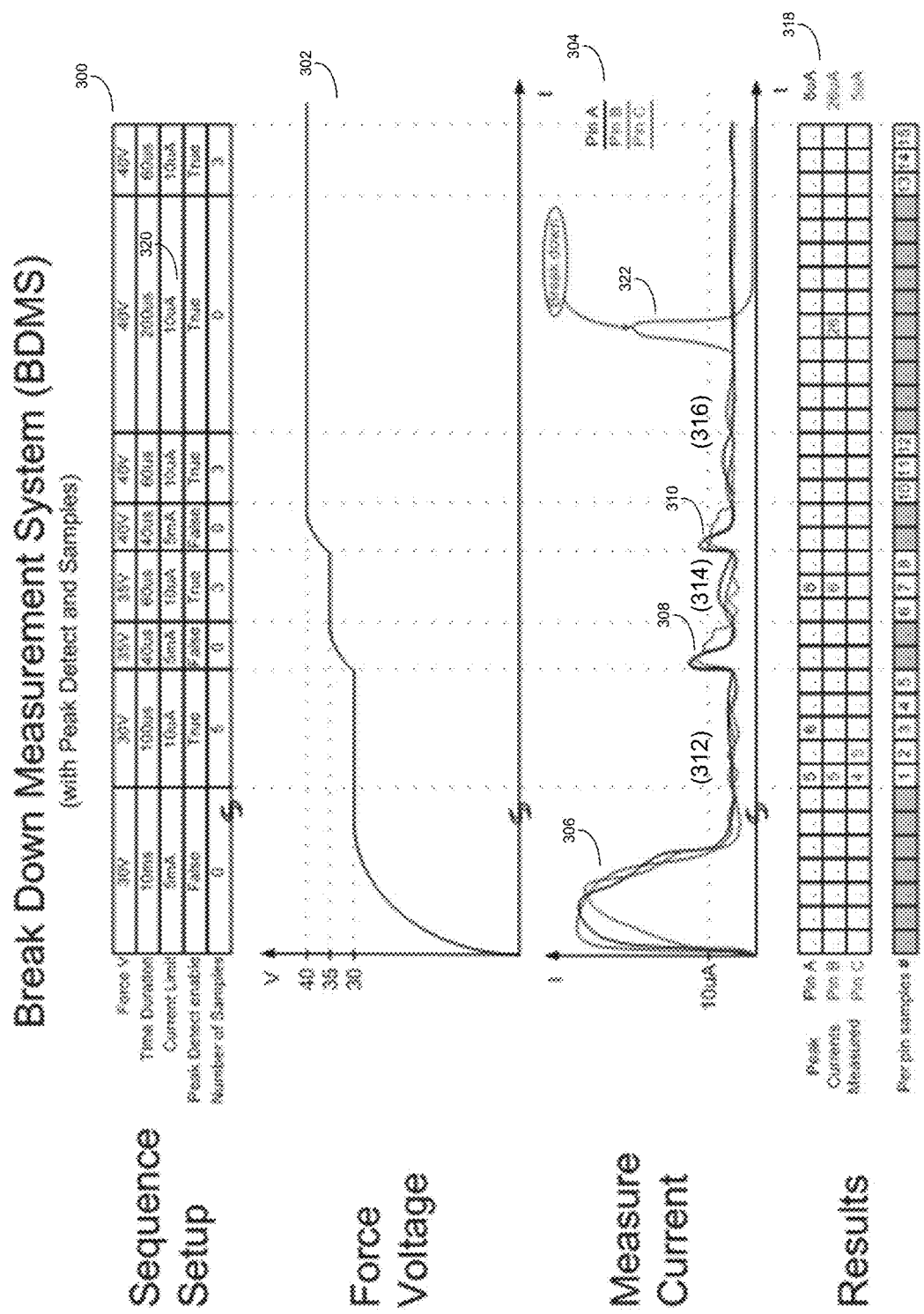
FIG. 4 is a diagrammatic view of a table generated by the automated test process of FIG. 2.

Referring also to FIG. 4, there is shown a graphical example of the manner in which processing system 12 (and automated test process 18) operates. For the following example, assume that there are three devices under test (e.g., devices under test 28, 30, 32), wherein "Pin A" corresponds to device under test 28, "Pin B" corresponds to device under test 30 and "Pin C" corresponds to device under test 32.

Table 300 defines voltage signal 34 as a signal that varies from 30 VDC to 40 VDC for the eight periods described above. Graph 302 is a timed-based graphical representation of the amplitude of voltage signal 34 as provided 100 by processing system 12 (and automated test process 18) to the device under test (e.g., devices under test 28, 30, 32). Graph 304 is a timed-based graphical representation of the monitored current values (e.g., current values 36), as monitored 102 by processing system 12 (and automated test process 18), wherein these monitored current values (e.g., current values 36) are indicative of the current flowing into each of devices under test 28, 30, 32. As seen within table 304, there are three areas of transient response (e.g., areas 306, 308, 310), where current spikes are experienced by devices under test 28, 30, 32 as the various components and conductors within these devices are charging. These three areas of transient response (e.g., area 306, 308, 310) are followed by steady state conditions (e.g., areas 312, 314, 316) that show much lower current flowing into devices under test 28, 30, 32. Accordingly and when processing system 12 (and automated test process 18) monitors 102 the current flowing into the devices under test (e.g., devices under test 28, 30, 32) during each of the plurality of voltages (included within voltage signal 34), the areas during which a transient response occurs (e.g., areas 306, 308, 310) should be ignored and such monitoring 102 should occur during the steady states areas (e.g., areas 312, 314, 316).

Continuing with the above-stated example in which devices under test 28, 30, 32 are exposed to voltage signal 34, processing system 12 (and automated test process 18) may store 104 the plurality of monitored current values (e.g., current values 36) for subsequent analysis/processing/review. This information is graphically illustrated as table 318, which shows the various current values that flowed into each of devices under test 28, 30, 32.

As discussed above, processing system 12 (and automated test process 18) may determine 106 if one or more of the plurality of monitored current values (e.g., current values 36) exceeds one or more of a plurality of current thresholds (e.g., current thresholds 38). The current thresholds for this example are defined within table 300. Note that cell 320 within table 300 defines a current threshold of 10 microamps during this portion (i.e., Portion 7) of voltage signal 34. However, note that within graph 304, device under test 30 is shown to absorb a current spike (e.g., current spike 322) wherein 26 microamps of current is flowing into device under test 30 (signifying a failure).

As discussed above, if one or more of the plurality of monitored current values (e.g., current values 36) exceeds one or more of the plurality of current thresholds (e.g., current thresholds 38), processing system 12 (and automated test process 18) may disconnect 108 the voltage signal (e.g., voltage signal 34) having the plurality of voltages from the at least one device under test (e.g., devices under test 28, 30, 32). Since processing system 12 (and automated test process 18) would determine 106 that the current flowing into device under test 30 (at 26 microamps) exceeds the defined current threshold of 10 microamps, processing system 12 (and automated test process 18) may disconnect 108 voltage signal 34 from device under test 30 to e.g., prevent total destruction of device under test 30 (for forensic purposes) and/or prevent damage to test head 14 and/or adapter board 26.

And since (as discussed above) switching system 212 may include three discrete switches (not shown), processing system 12 (and automated test process 18) may disconnect 108 voltage signal 34 from device under test 30 while allowing for the testing of devices under test 28, 32 to continue.

General:

As will be appreciated by one skilled in the art, the present disclosure may be embodied as a method, a system, or a computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. The computer-usable or computer-readable medium may also be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to the Internet, wireline, optical fiber cable, RF, etc.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network/a wide area network/the Internet.

The present disclosure is described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer/special purpose computer/other programmable data processing apparatus, such that the instructions, which execute via the processor of the computer or other programmable data processing apparatus, create means for implementing the functions/acts specified in the flowchart and/or block diagram block or blocks.

These computer program instructions may also be stored in a computer-readable memory that may direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The flowcharts and block diagrams in the figures may illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. An automated test platform for testing at least one device under test, the automated test platform comprising:
  a test head configured to receive the at least one device under test;
  a processing system configured to:
    provide a voltage signal having a plurality of voltages to the at least one device under test,
    monitor a current flow into the at least one device under test during each of the plurality of voltages, thus generating a plurality of monitored current values that correspond to the plurality of voltages, and
    determine if one or more of the plurality of monitored current values exceeds one or more of a plurality of current thresholds.

2. The automated test platform of claim 1 further comprising:
  an interconnection platform configured to couple the processing system and the test head.

3. The automated test platform of claim 1 further comprising:

an adapter board configured to couple the at least one device under test to the test head.

4. The automated test platform of claim 3 wherein the at least one device under test includes a plurality of devices under test.

5. The automated test platform of claim 4 wherein the adapter board is configured to couple the plurality of devices under test to the test head.

6. The automated test platform of claim 1 further comprising:
a switching system associated with the at least one device under test.

7. The automated test platform of claim 6 wherein the switching system is configured to selectively disconnect the voltage signal having the plurality of voltages from the at least one device under test.

8. The automated test platform of claim 7 wherein the processing system is further configured to:
if one or more of the plurality of monitored current values exceeds one or more of the plurality of current thresholds, disconnect the voltage signal having the plurality of voltages from the at least one device under test.

9. The automated test platform of claim 6 wherein the switching system includes one or more of:
at least one mechanical switch assembly; and
at least one solid state switch assembly.

10. The automated test platform of claim 1 wherein the voltage signal having the plurality of voltages is a temporally-defined voltage signal having a plurality of voltages, wherein an amplitude and a duration are defined for each of the plurality of voltages.

11. The automated test platform of claim 10 wherein the plurality of monitored current values is temporally aligned with the temporally-defined voltage signal.

12. A computer-implemented method, executed on a computing device, the computer-implemented method comprising:
providing a voltage signal having a plurality of voltages to the at least one device under test;
monitoring a current flow into the at least one device under test during each of the plurality of voltages, thus generating a plurality of monitored current values that correspond to the plurality of voltages; and
determining if one or more of the plurality of monitored current values exceeds one or more of a plurality of current thresholds.

13. The computer-implemented method of claim 12 wherein the voltage signal having the plurality of voltages is a temporally-defined voltage signal having a plurality of voltages, wherein an amplitude and a duration are defined for each of the plurality of voltages.

14. The computer-implemented method of claim 13 wherein the plurality of monitored current values is temporally aligned with the temporally-defined voltage signal.

15. A computing system including a processor and memory configured to perform operations comprising:
providing a voltage signal having a plurality of voltages to the at least one device under test;
monitoring a current flow into the at least one device under test during each of the plurality of voltages, thus generating a plurality of monitored current values that correspond to the plurality of voltages; and
determining if one or more of the plurality of monitored current values exceeds one or more of a plurality of current thresholds.

16. The computing system of claim 15 wherein the voltage signal having the plurality of voltages is a temporally-defined voltage signal having a plurality of voltages, wherein an amplitude and a duration are defined for each of the plurality of voltages.

17. The computing system of claim 16 wherein the plurality of monitored current values is temporally aligned with the temporally-defined voltage signal.

18. A computer program product residing on a computer readable storage medium having a plurality of instructions stored thereon which, when executed across one or more processors, causes at least a portion of the one or more processors to perform operations comprising:
providing a voltage signal having a plurality of voltages to the at least one device under test;
monitoring a current flow into the at least one device under test during each of the plurality of voltages, thus generating a plurality of monitored current values that correspond to the plurality of voltages; and
determining if one or more of the plurality of monitored current values exceeds one or more of a plurality of current thresholds.

19. The computer program product of claim 18 wherein the voltage signal having the plurality of voltages is a temporally-defined voltage signal having a plurality of voltages, wherein an amplitude and a duration are defined for each of the plurality of voltages.

20. The computer program product of claim 19 wherein the plurality of monitored current values is temporally aligned with the temporally-defined voltage signal.

* * * * *